United States Patent
Kay et al.

(10) Patent No.: US 10,910,508 B1
(45) Date of Patent: Feb. 2, 2021

(54) METHOD OF FABRICATING PHOTOSENSITIVE DEVICES WITH REDUCED PROCESS-TEMPERATURE BUDGET

(71) Applicant: National Technology & Engineering Solutions of Sandia, LLC, Albuquerque, NM (US)

(72) Inventors: Randolph R. Kay, Albuquerque, NM (US); Seethambal S. Mani, Albuquerque, NM (US); Andrew Pomerene, Albuquerque, NM (US); Andrew Lea Starbuck, Albuquerque, NM (US); Reinhard Brock, Albuquerque, NM (US); Douglas Chandler Trotter, Albuquerque, NM (US); Adam Jones, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 16/401,821

(22) Filed: May 2, 2019

Related U.S. Application Data

(60) Provisional application No. 62/667,173, filed on May 4, 2018.

(51) Int. Cl.
*H01L 27/14* (2006.01)
*H01L 31/18* (2006.01)
*H01L 31/102* (2006.01)
*H01L 31/0216* (2014.01)
*H01L 31/0232* (2014.01)

(52) U.S. Cl.
CPC .......... *H01L 31/18* (2013.01); *H01L 31/0216* (2013.01); *H01L 31/02327* (2013.01); *H01L 31/102* (2013.01)

(58) Field of Classification Search
None
See application file for complete search history.

(56) References Cited

U.S. PATENT DOCUMENTS

| | | | |
|---|---|---|---|
| 5,901,901 A * | 5/1999 | Schneegans | H01L 24/03 228/254 |
| 6,548,878 B1 * | 4/2003 | Nauleau | H01L 31/02005 257/431 |
| 8,907,439 B1 | 12/2014 | Kay et al. | |

(Continued)

*Primary Examiner* — Ali Naraghi
(74) *Attorney, Agent, or Firm* — Martin I. Finston

(57) ABSTRACT

A method is provided for fabricating a backside-illuminated photodetector in which a device wafer is joined to a readout wafer in an IC hybridization step. Before the IC hybridization step, the device layer is defined in the device wafer, and an LPCVD layer is formed over the device layer. The LPCVD layer may be a passivation layer, an antireflection coating, or both. The side of the device wafer having the LPCVD layer is bonded to a handle wafer, the IC is hybridized by mating the device wafer to the readout wafer, and the handle wafer is then removed, exposing the LPCVD layer. Because the LPCVD layer is formed before the active devices are fabricated, it can be made by high-temperature techniques for deposition and processing. Accordingly, a layer of high quality can be fabricated without any hazard to the active devices.

9 Claims, 11 Drawing Sheets

(56) References Cited

U.S. PATENT DOCUMENTS

| | | | |
|---|---|---|---|
| 2011/0083722 A1* | 4/2011 | Atwater | H01L 31/1852 136/246 |
| 2011/0136288 A1* | 6/2011 | Duane | G01J 5/20 438/59 |
| 2019/0074214 A1* | 3/2019 | Lee | H01L 31/105 |

* cited by examiner

METHOD OF FABRICATING PHOTOSENSITIVE DEVICES WITH REDUCED PROCESS-TEMPERATURE BUDGET

CROSS-REFERENCE TO RELATED APPLICATION

This application claims the benefit of U.S. Provisional Application No. 62/667,173, filed May 4, 2018, under the title "METHOD OF FABRICATING PHOTOSENSITIVE DEVICES WITH REDUCED PROCESS-TEMPERATURE BUDGET", the entirety of which is hereby incorporated herein by reference.

ACKNOWLEDGEMENT OF GOVERNMENT SUPPORT

This invention was made with United States Government support under Contract No. DE-NA0003525 between National Technology & Engineering Solutions of Sandia, LLC and the United States Department of Energy/National Nuclear Security Administration. The United States Government has certain rights in this invention.

FIELD OF THE INVENTION

This invention relates to semiconductor fabrication methods, and more particularly to CMOS processes as applied to the fabrication of photodiodes and similar devices.

ART BACKGROUND

Silicon photodetectors can be made to be front-side or backside illuminated. In front-side illuminated photodetectors, the array of photodiodes is fabricated directly on the face of a silicon wafer, and electronic processing circuitry is fabricated over the photodiode array. This approach is simpler to manufacture, but it suffers reduced efficiency because the intervening circuitry reduces the amount of light that can be captured in the photodiodes. Scattering of light within the circuitry can also lead to reduced performance.

By contrast, the photodiodes in backside illuminated photodetectors are placed so as to face the light source without intervening circuitry. This is achieved by fabricating the photodiodes on a first substrate (the "detector IC") and fabricating the the processing circuitry on a second substrate (the "readout IC"). The two substrates are bonded together in a step of "IC hybridization", and the detector IC is thinned to minimize optical loss.

Although the advantages of backside illuminated photodetectors have been amply demonstrated, their manufacture has encountered some difficulties. For example, it is generally desirable to add a surface passivation layer and an anti-reflection coating (ARC) to the photodetector. These layers are conventionally added in a step that comes after the detector-to-readout IC hybridization. However, the process temperatures required for depositing and growing the high-quality films that are needed can exceed the temperature tolerance of the underlying structures. More broadly, these post-hybridization processes pose a risk of damage to the manufacturing intermediate, which is by itself a high-value product.

Thus, new approaches are still needed that reduce risk in the manufacture of backside illuminated silicon photodetectors.

SUMMARY OF THE INVENTION

We have found a new manufacturing process that grows and deposits high-quality films without limitation by post-hybridization temperature restrictions. Our new approach also reduces risk by reducing the number of process steps that need to be performed on the high-value hybridized sensor.

Briefly, we perform a low-energy implant on a device wafer to passivate the photodetector surface before the IC hybridization step. After the implant, but still before the IC hybridization, we form a two-layer stack consisting of a silicon dioxide layer and a silicon nitride layer. These layers constitute the antireflection coating (ARC). More specifically, the silicon dioxide layer presents a low-stress interface to the silicon device layer. The silicon nitride layer provides a refractive index effective for suppressing reflections within a desired thickness range. The thicknesses of the layers are tailored to provide a reflection minimum at the desired wavelength.

The ARC side of the device wafer is bonded to a handle wafer by direct oxide-to-oxide bonding or a similar technique. The resulting composite structure is, in effect, an SOI wafer having a handle layer.

After the hybridization step in which the optical detectors are mated to a readout integrated circuit, the handle layer of the SOI wafer can be removed, thus exposing the ARC layer.

Because the ARC is formed before the active devices are fabricated, it can be made by high-temperature techniques for deposition and processing without any hazard to the active devices. Accordingly, an ARC of high quality can be fabricated.

Quantum efficiencies greater than 90% were demonstrated at the designed operating wavelength in devices made by the process described here.

Accordingly, an embodiment of the invention relates to a method for fabricating backside illuminated silicon photodetectors. An LPCVD layer comprising high-temperature silicon oxide, silicon oxynitride, or silicon nitride is added to a float-zone silicon device wafer prior to any steps in the fabrication of active devices. The LPCVD layer may have one, two, or more sublayers of different compositions, such as the two-layer stack of silicon dioxide and silicon nitride discussed above.

In some embodiments, the LPCVD layer is an antireflection coating (ARC) whose thickness (or combination of thicknesses) is selected to provide a reflection minimum at a desired operating wavelength. Accordingly, the LPCVD layer will be referred to generally, below, as the "ARC". However, other embodiments are possible that advantageously use similar techniques to deposit a passivation layer that has not been tailored for antireflective properties. In the rest of this document, we will use the term "ARC" inclusively; that is, both antireflective layers and simple passivation layers will be referred to as "ARCs" provided only that they are LPCVD layers formed in similar process steps.

The ARC side of the device wafer is bonded to a handle wafer. This will typically be done by direct oxide-to-oxide bonding between bonding layers on the respective wafers, or by a similar technique. The device wafer is then thinned by removing material from the device-layer side, i.e., from the side opposite to the LPCVD layer.

Active devices constituting a photodetector or photodetector array are fabricated on the device-layer side using, e.g., standard integrated circuit processing techniques.

The optical detectors are then mated to a readout integrated circuit. Then, the bonding layers are removed so that the silicon device layer is separated from the handle wafer and the LPCVD layer is exposed.

In embodiments, one of the oxide-to-oxide bonding layers is an HDP oxide layer formed on the LPCVD layer.

In embodiments, one of the oxide-to-oxide bonding layers is a thermal oxide layer grown on the handle wafer.

In embodiments, a device layer is defined in the device wafer by performing a passivating, low-energy ion implantation into the device wafer.

In embodiments, the passivating, low-energy ion implantation is performed through an oxide layer that is removed after the implantation and replaced with a layer of thermal oxide before the LPCVD layer is added.

DETAILED DESCRIPTION

Figure 1:
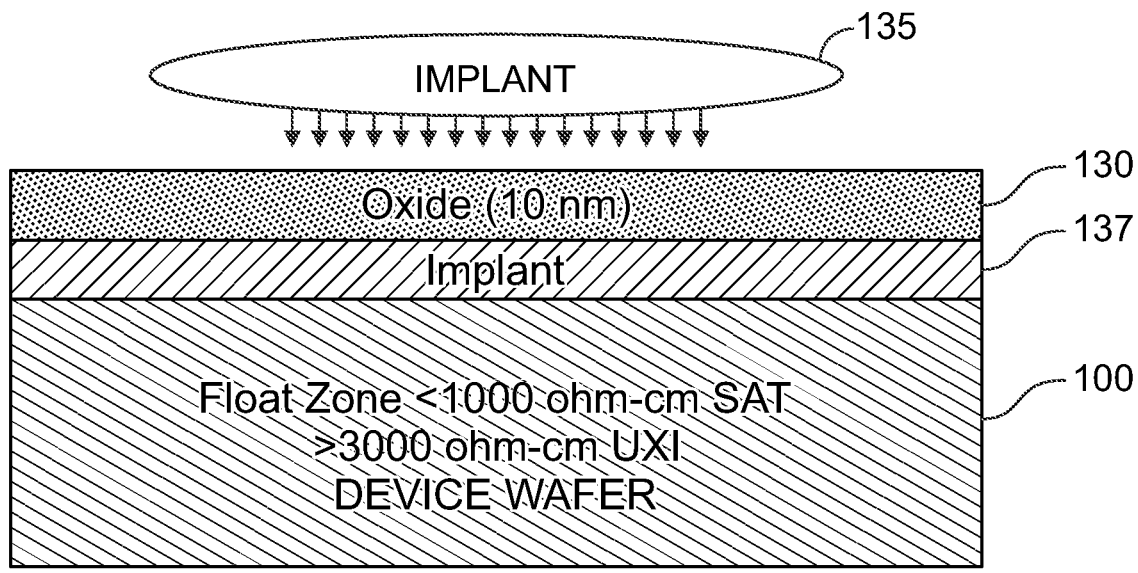
FIGS. 1-13 illustrate successive stages in the fabrication of an example array of photodiodes according to the principles described below.
Figure 2:
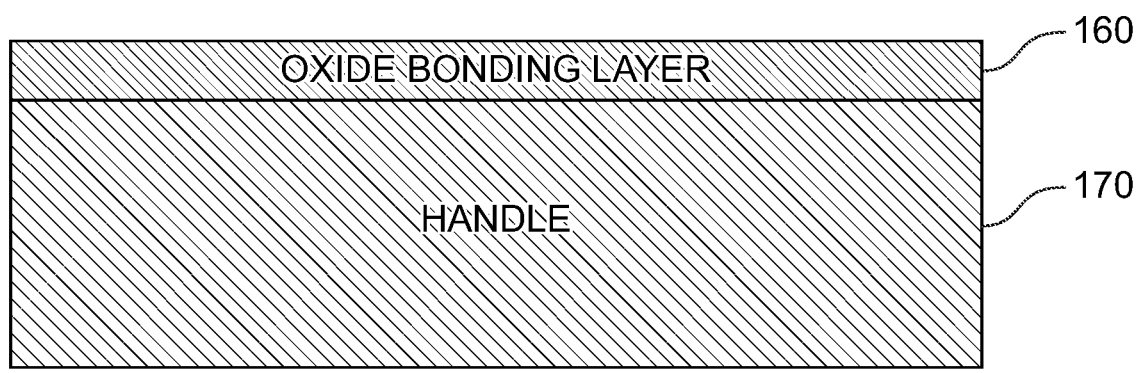

A process flow according to an example embodiment is carried out in accordance with the following steps:
A. Wafer Preparation:

(1) Start with a float-zone silicon wafer 100 (the "device wafer") and a second silicon wafer 170 (the "handle wafer"). (FIGS. 1 and 2.)

(2) Bonding layer: Grow a 100-nm layer 160 of thermal oxide on the handle wafer for the handle-side bonding layer. (FIG. 2.)

(3) Implant oxide: Oxidize the device layer to a depth of 10 nm to form the silicon dioxide "implant oxide" layer 130. (FIG. 1).

(4) Backside implant: Perform a back-side, low-energy implant 135 to dope the device wafer without changing its conductivity type. For example, implant arsenic in an n-type wafer. An example arsenic implant is 5 keV, 1e15, followed by 90 keV, 1e14, followed by a spike anneal at 1050° C. The implant lowers the electrical resistivity of the surface, provides an electric field to drift photo carriers away from the surface and into the bulk of the device, and electrically passivates the device surface. This forms the device layer 137 of the wafer. (FIG. 1.)

Figure 3:
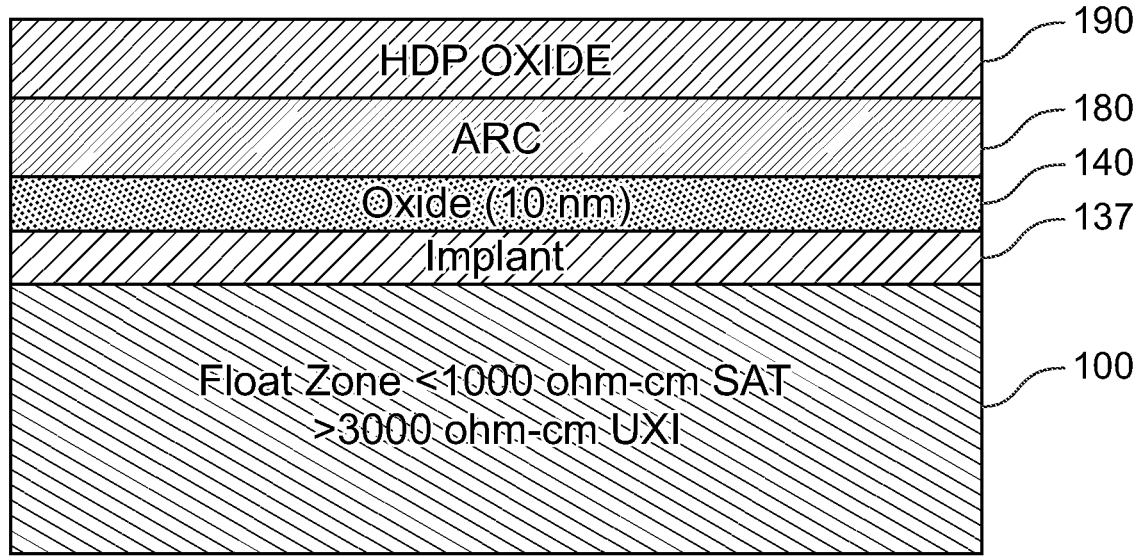

(5) Thermal oxide: Strip away the implant oxide layer 130 by etching and replace it by growing a 10-nm layer 140 of thermal oxide. This has the benefit of replacing the implant-damaged oxide layer with a layer of high-quality oxide. (FIG. 3.)

(6) Antireflection coating: Deposit a 50-nm layer 180 of LPCVD silicon nitride over the regrown thermal oxide 140 on the device wafer for the anti-reflection coating (ARC). As noted above, the "ARC" may in some cases be a passivation layer rather than an antireflection coating. Alternative compositions, also deposited by LPCVD, are high-temperature silicon oxide and silicon oxynitride. (FIG. 3.) In alternate embodiments, any combination of layers having material compositions selected from among silicon nitride, silicon oxide, and silicon oxynitride may constitute the LPCVD layer.

(7) HDP oxide: Deposit a 200-nm layer 190 of HDP oxide at 400° C. over the ARC layer, then thin it back to about 100 nm by chemical-mechanical polishing (CMP). (FIG. 3)

(8) Bonding: Flip the device wafer so that the HDP oxide 190 of the device wafer is facing the thermal oxide layer 160 of the handle wafer and bond the thermal oxide bonding layer of the handle wafer to the thinned HDP oxide layer of the device wafer. A preferred bonding method is homogeneous (e.g., oxide-to-oxide) direct bonding with plasma activation of the bonding surfaces.

An example process is the ZiBond® process of Invensas™ (formerly Ziptronix, Inc.), a subsidiary of Xperi Corporation. To assure adequate bonding strength, the bond should be annealed at least at the HDP deposition temperature. A typical anneal temperature is 350° C., although both higher and lower temperatures are also possible.

Figure 4:
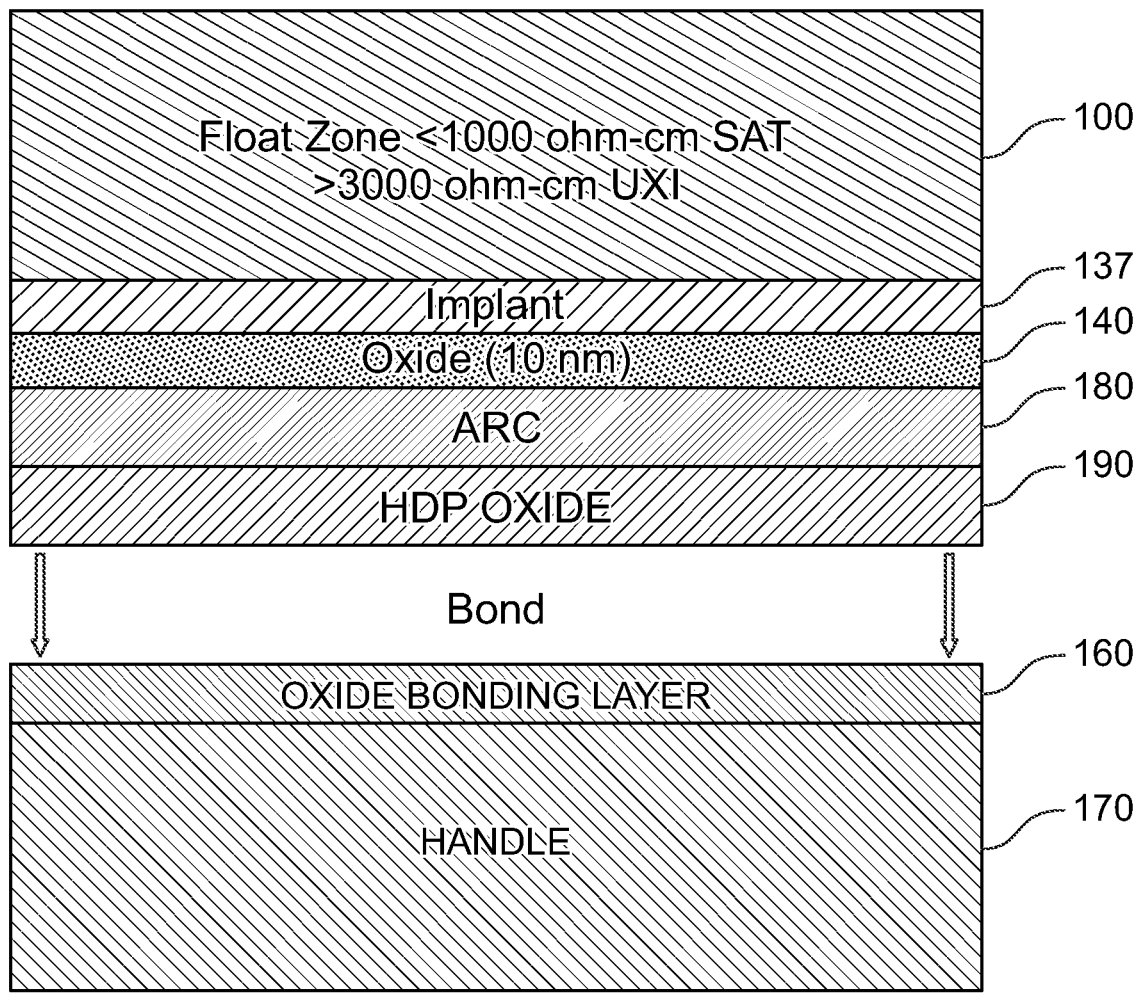

It should be noted that although a homogeneous bond is preferred, alternative dielectrics, such as silicon nitride or oxynitride may be substituted for one or both of the bonding layers. However, any bonding material must be selected so that it can be subsequently removed by an etchant that will stop at the silicon portion of the handle wafer and that will not damage the ARC layer of the device wafer. The bonding material must also produce a bond strong enough to withstand the subsequent thinning of the device layer, which involves a mechanical grinding and polishing step. FIG. 4 illustrates the formation of the direct oxide-to-oxide bond.

Figure 5:
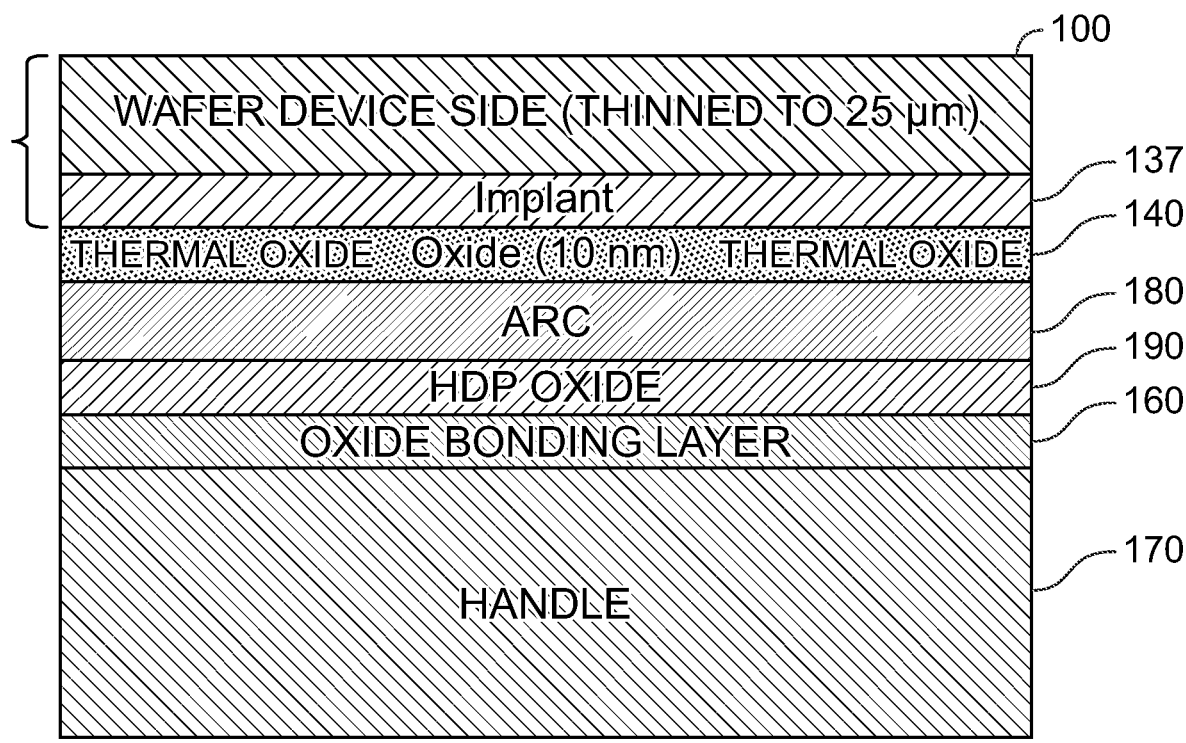
Figure 6:
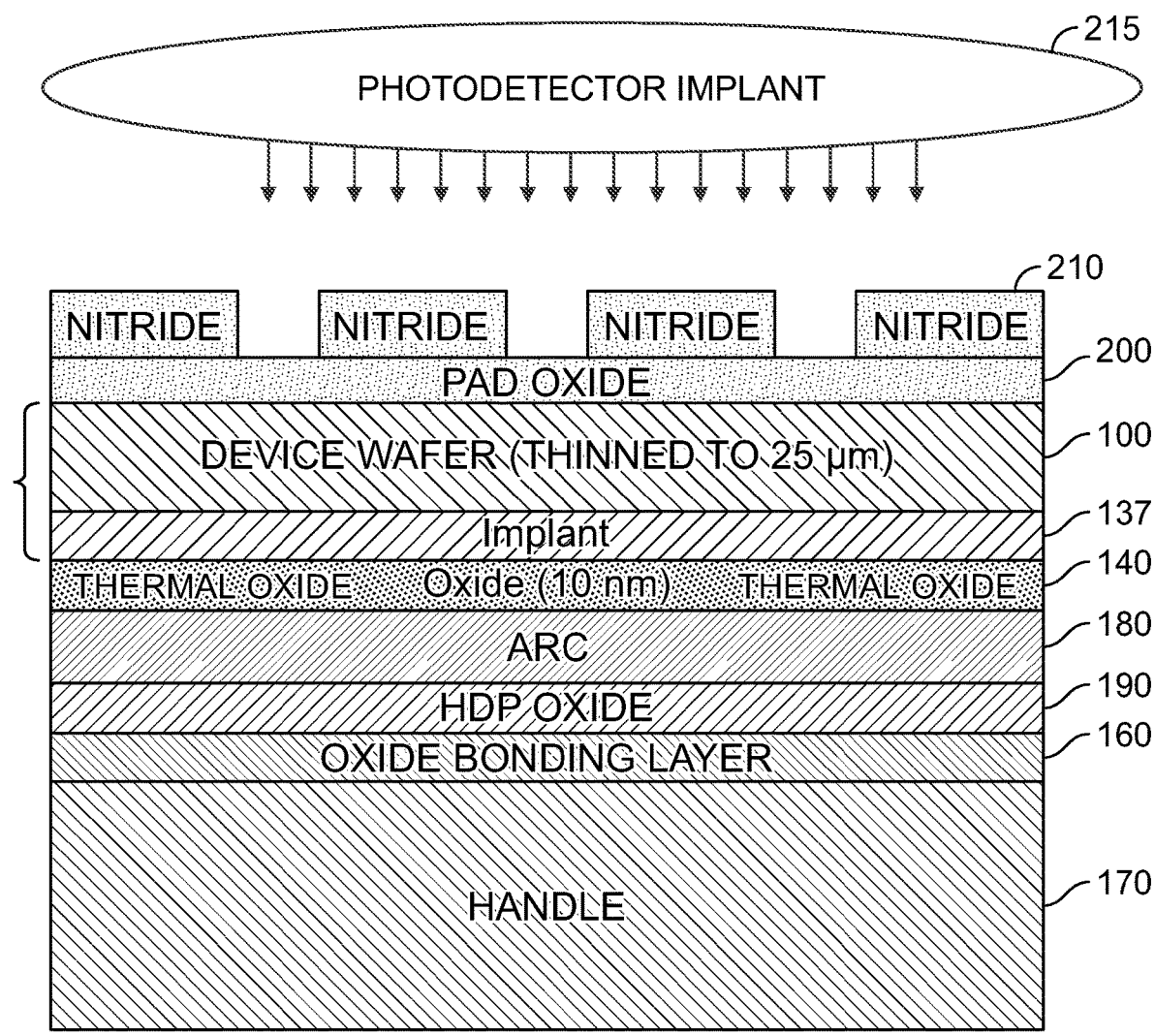

(9) Device layer thinning: From the side opposite to the bonded handle wafer, grind and polish the device wafer back to a thickness of 25 µm or other thickness, depending on the desired optical absorption properties of the end-product photodetectors. FIG. 5 shows a thinned device wafer 100.
B. Photodetector Fabrication:

(10) Pad oxide: Fabricate the photodetectors on the device layer side of the device wafer. This can be done using standard microelectronic fabrication techniques. The first step in this phase of the fabrication is to grow a layer 200 of pad oxide. An example growth sequence is: 800° C. in steam for 45 minutes; 800° C. in oxygen for 20 minutes; 800° C. in nitrogen for 15 minutes. (FIG. 6.)

(11) SiN mask: The next step in the photodetector fabrication is to deposit a silicon nitride mask 210. In an example, a silicon nitride film is deposited by LPCVD at 781° C. for 22 minutes. The SiN mask is then lithographically patterned and etched to define implant windows for the cathode (n+) and anode (p+) regions of the photodetectors. (FIG. 6.)

Figure 7:
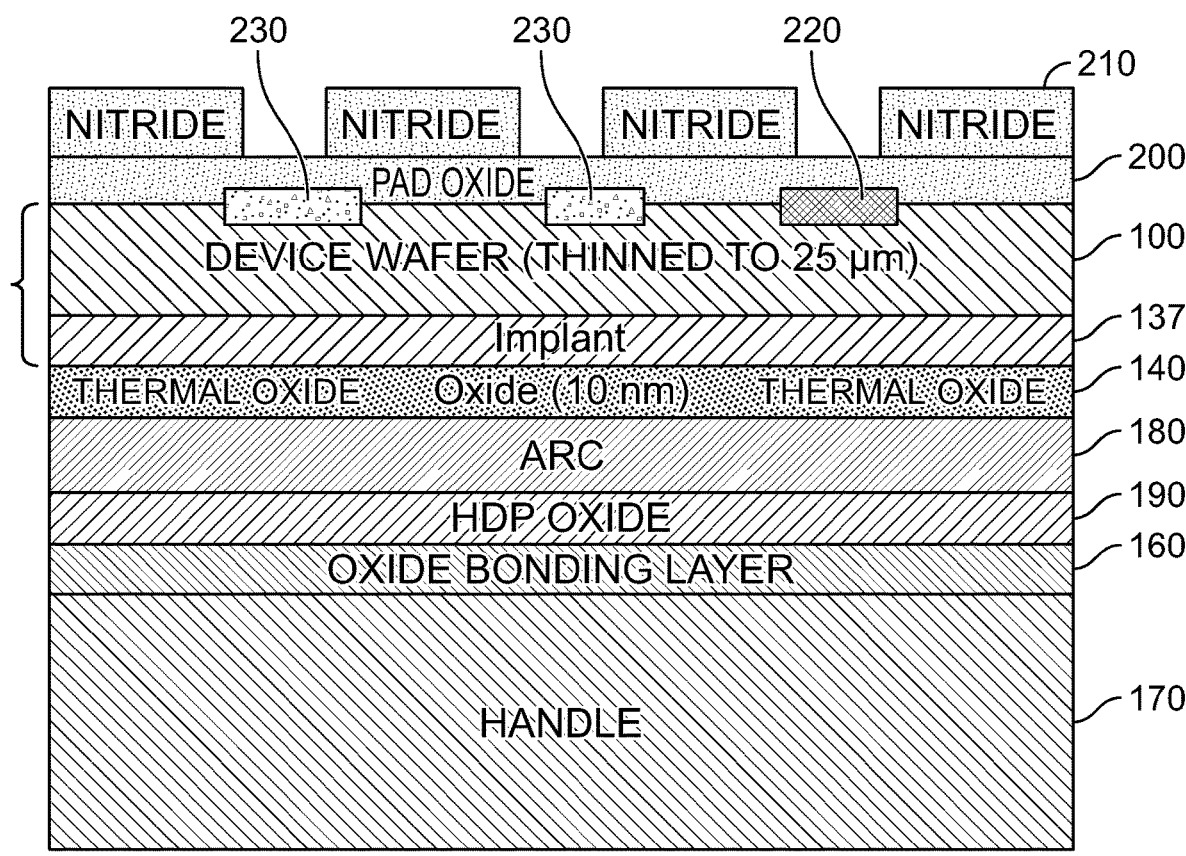

(12) Implant: Ion implants 215 are then performed through the SiN mask to form the cathode regions 220 and anode regions 230 of the photodetectors, followed by a 15 minute anneal at 900° C. (FIGS. 6 and 7.)

Figure 8:
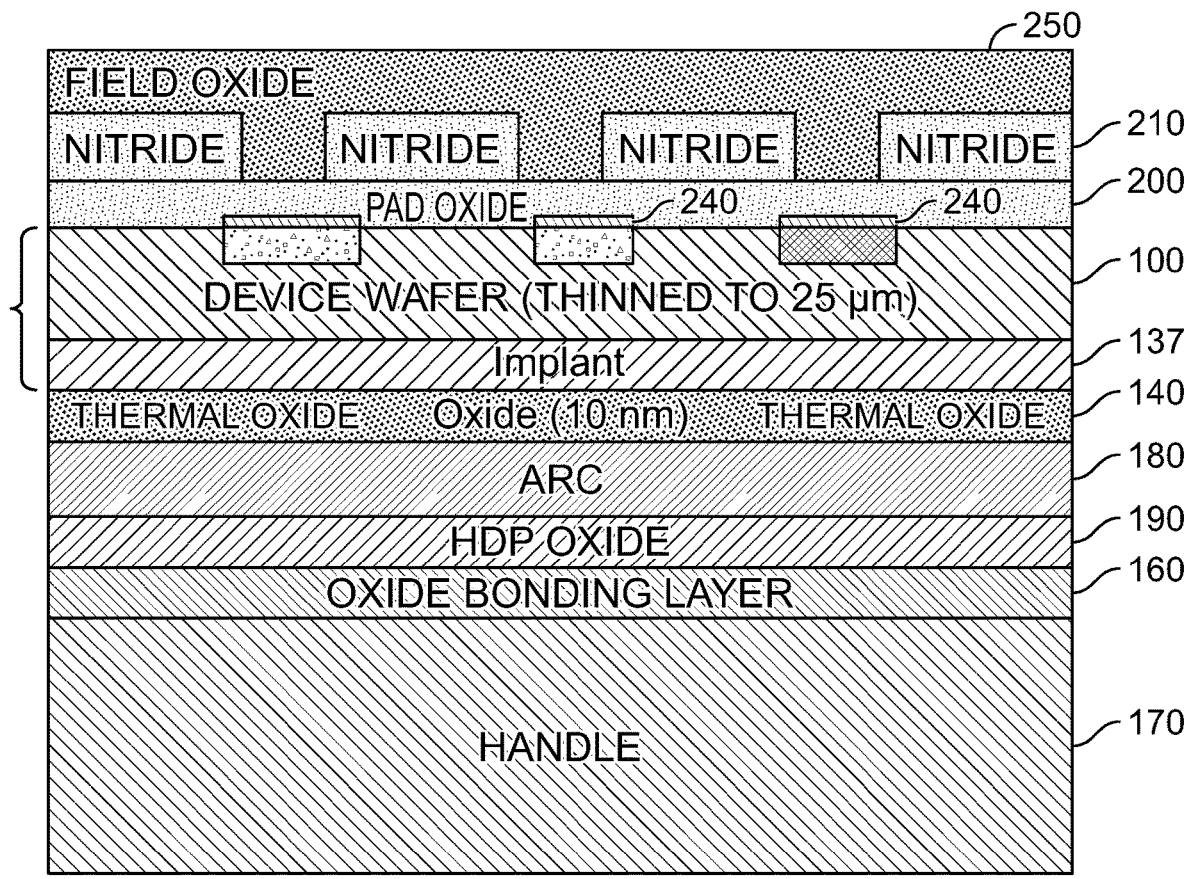

(13) Silicide contacts: The pad oxide is removed from the contact areas above the cathode and anode implants, and Ti silicide contacts 240 are deposited. A layer of field oxide 250 is deposited by high-density plasma CVD, covering the Ti silicide contacts and the SiN mask. (FIG. 8.)

Figure 9:
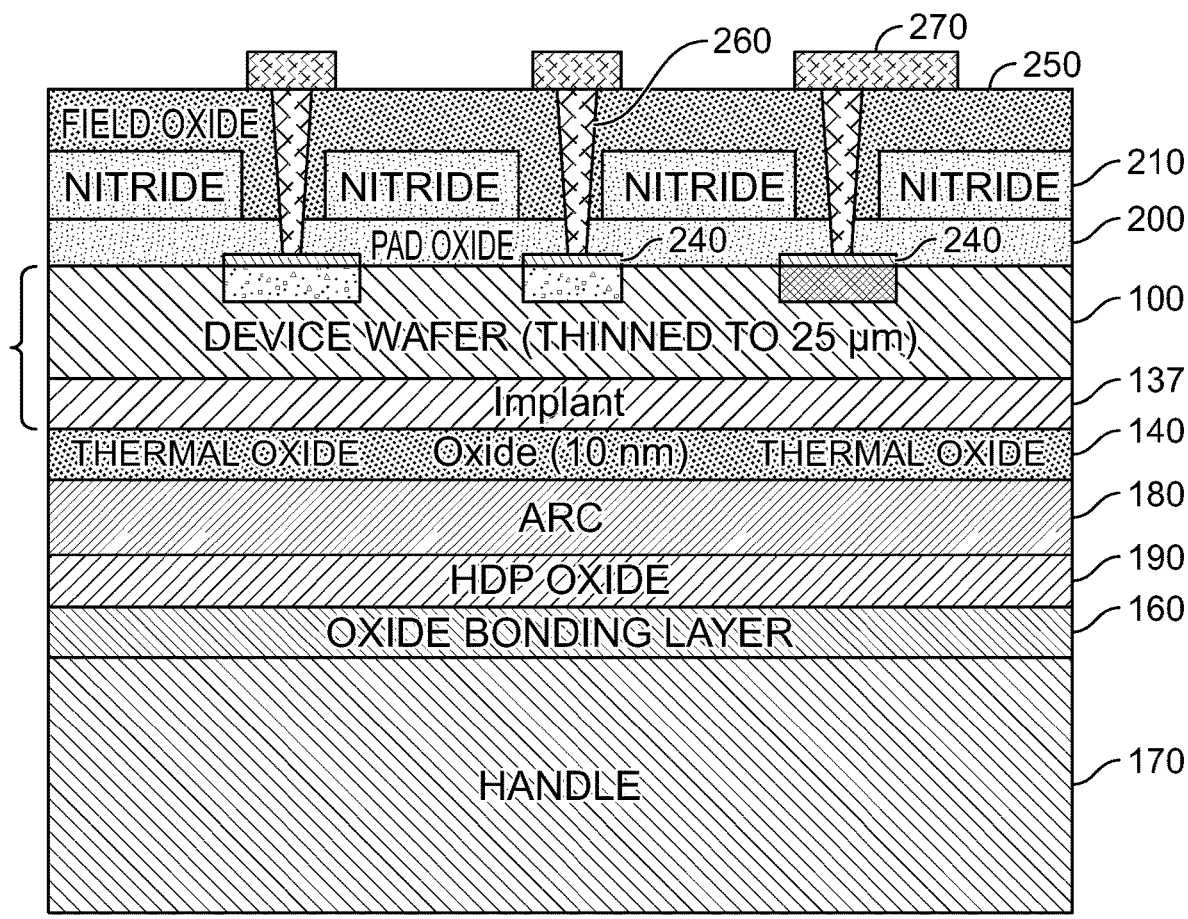

(14) Vias: Contact vias 260 through the field oxide 250 are conventionally defined by lithography, lined with Ti/TiN, and filled with tungsten. The outer tungsten surface is polished flush by CMP. Contact metal 270 for the photodetector electrodes is deposited and conventionally patterned and etched. This completes the photodetector fabrication sequence. (FIG. 9.)
C. Attachment to Readout Wafer:

(15) Contact pads: The device wafer bearing the completed photodetectors is mated to a readout wafer, which can be fabricated using standard microelectronic fabrication techniques. An example method for hybrid attachment of the device wafer to the readout wafer is flip chip connection through indium bumps.

Figure 10:
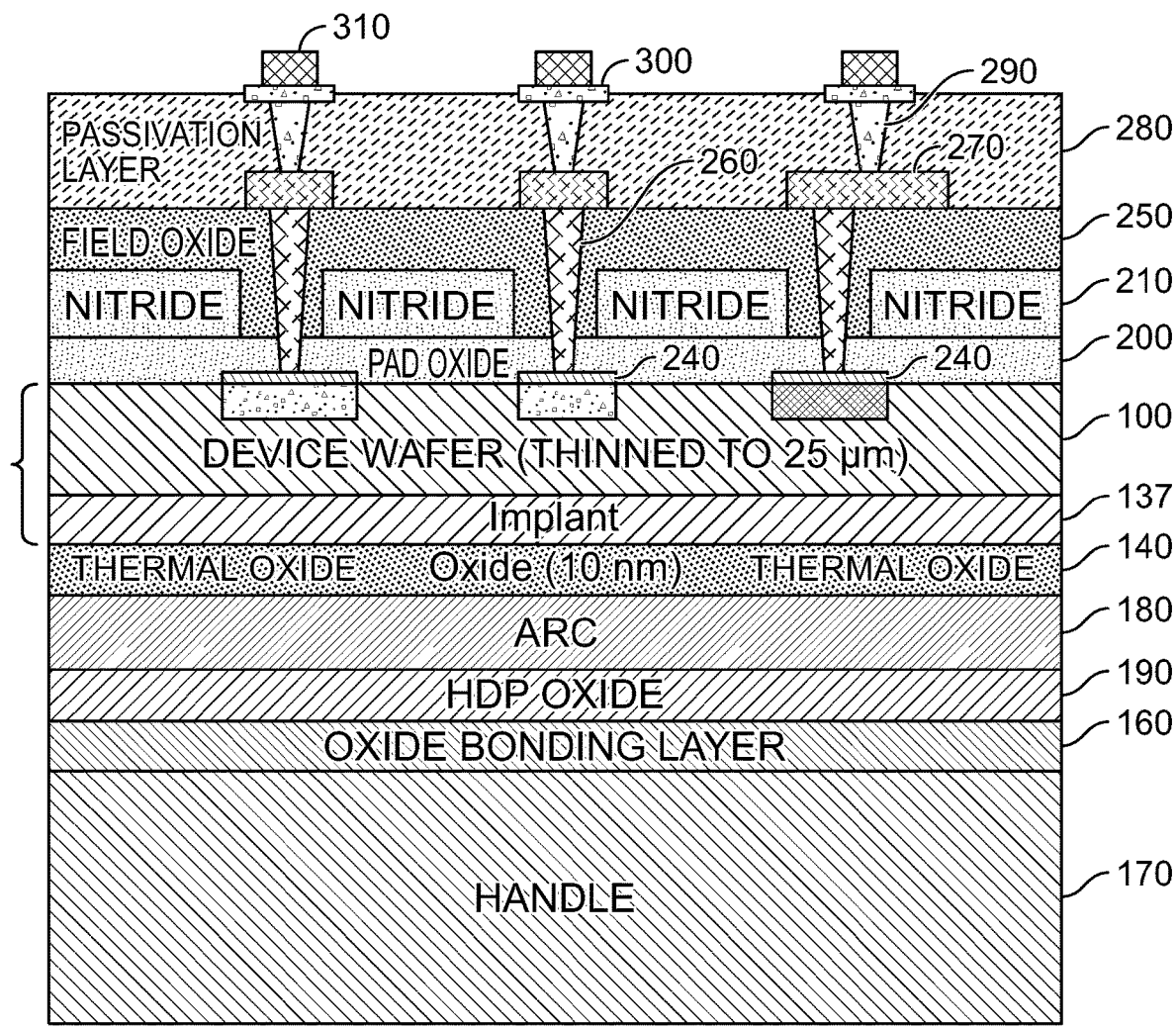

To prepare the device wafer for flip chip connection, a passivation layer 280 of silicon dioxide is deposited by CVD over the metal contacts and contact openings 290 are formed in the passivation layer. Conventional liftoff processes are used to fill the openings and add contact pads 300 of chromium or titanium, and to add indium bumps 310 over the contact pads. (FIG. 10.)

Figure 11:
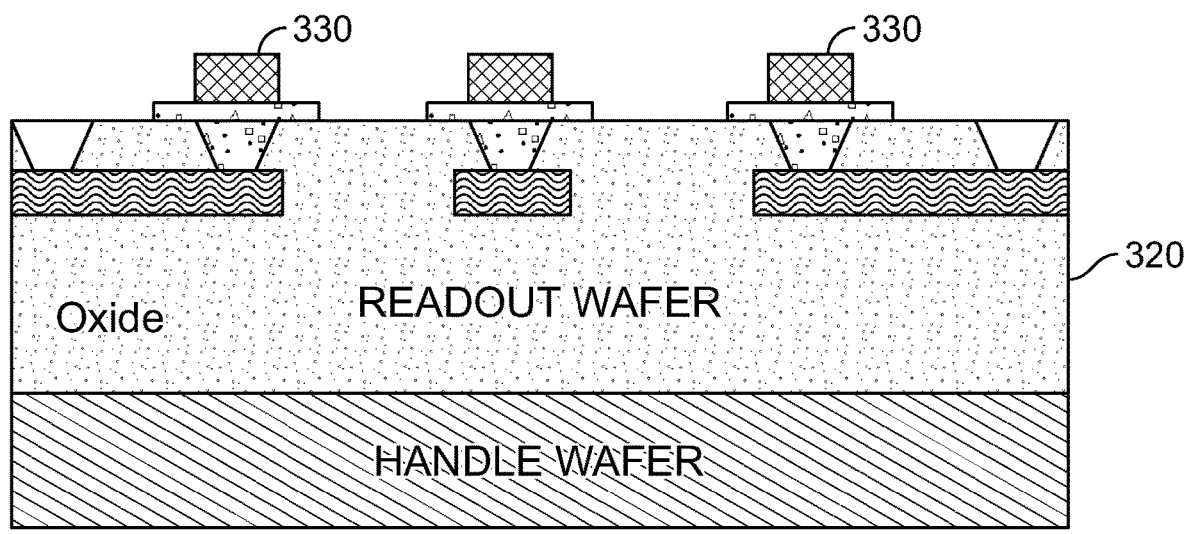
Figure 12:
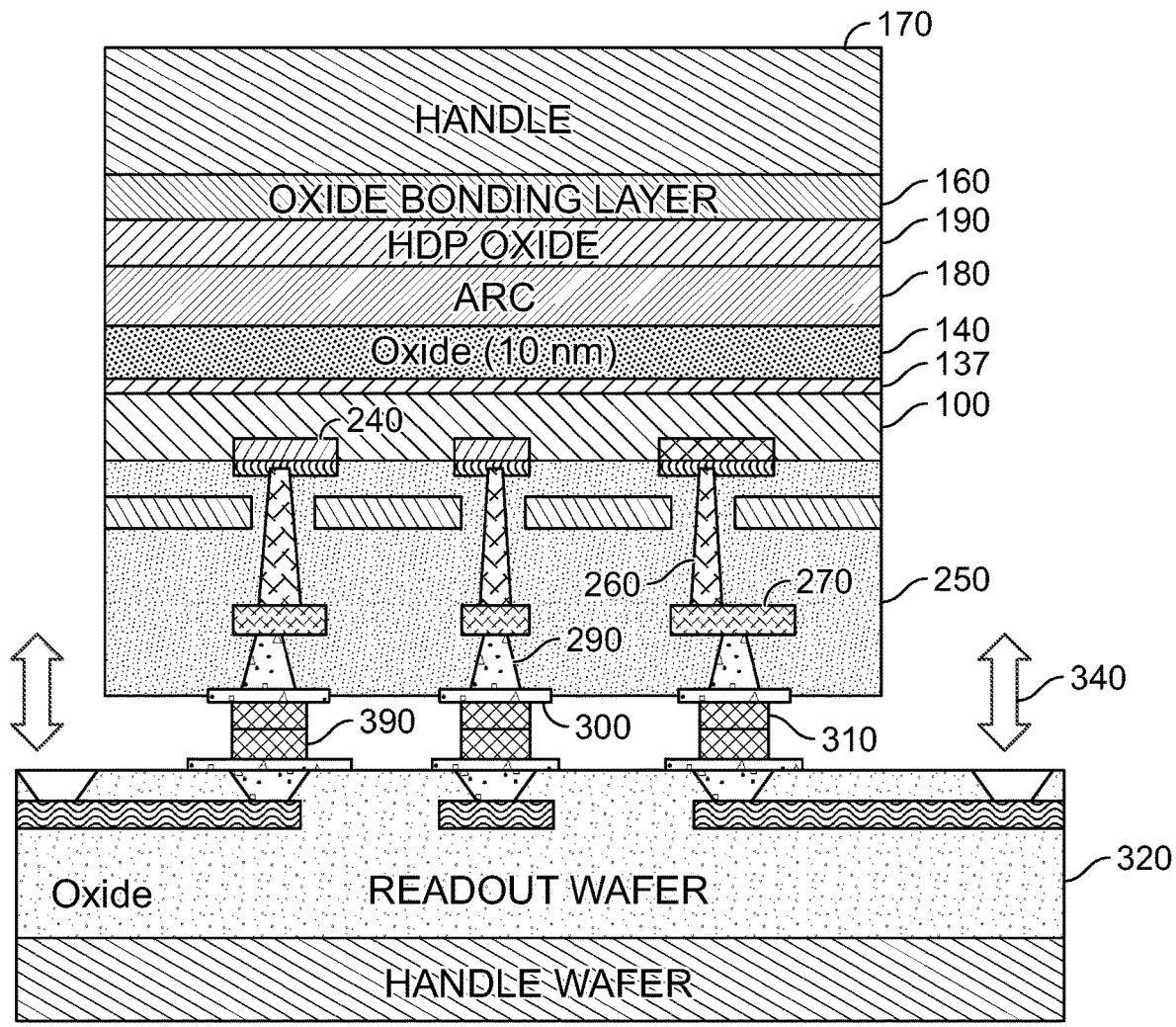

(16) Flip chip attachment: The readout wafer 320 is prepared with a pattern of indium bumps 330 aligned with the indium bumps on the device wafer. (FIG. 11.) The device wafer is flipped and electrically and mechanically attached to the readout wafer by compression or thermocompression 340 to bond the aligned pairs of indium bumps. (FIG. 12.)

In the resulting assembly, the photodetector side of the device wafer is facing the readout wafer. Hence the silicon handle wafer is on the side of the device wafer opposite to the readout wafer, and it is oriented so that the silicon handle portion is outermost, and the antireflection coating is facing the readout wafer.

Figure 13:
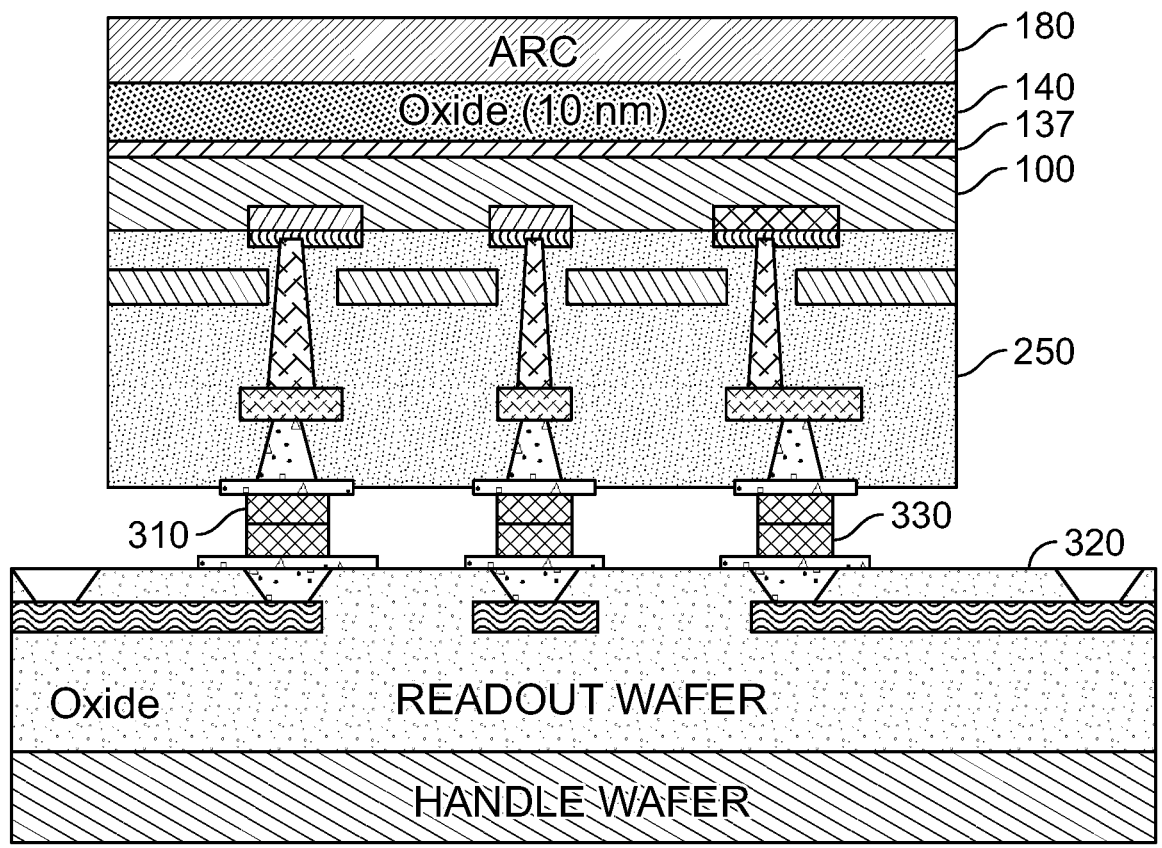

(17) Handle removal: The handle wafer is removed from the device wafer, e.g. by mechanical grinding followed by etching to remove the bonding layers. FIG. 13 shows the final assembly with the handle 170 and bonding layers 160, 190 removed to expose the ARC 180.

We claim:

1. A method for fabricating an optoelectronic device, comprising: forming an LPCVD layer on a silicon device wafer by low-pressure chemical vapor deposition, wherein the LPCVD layer consists of one or more sublayers, each sublayer comprising high-temperature silicon oxide, silicon oxynitride, or silicon nitride; forming a first dielectric bonding layer on the LPCVD layer; providing a handle wafer having a second dielectric bonding layer; bonding the first dielectric bonding layer to the second dielectric bonding layer so as to bond the device wafer to the handle wafer; forming at least one photosensitive active device on a silicon device layer in a face of the silicon device wafer opposite to the LPCVD layer; and removing the first and second dielectric bonding layers so that the silicon device layer is separated from the handle wafer and so that the LPCVD layer is exposed.

2. The method of claim 1, further comprising, before the forming of the at least one photosensitive active device, thinning the silicon device wafer from the face thereof that is opposite to the LPCVD layer.

3. The method of claim 1, further comprising: forming metal electrical contacts on the silicon device layer; and attaching the metal electrical contacts to a readout wafer.

4. The method of claim 3, wherein the first and second dielectric bonding layers are removed after the attaching of the metal electrical contacts to the readout wafer.

5. The method of claim 1, wherein the LPCVD layer constitutes an antireflection coating.

6. The method of claim 1, wherein the first dielectric bonding layer formed on the LPCVD layer is an HDP oxide layer.

7. The method of claim 1, wherein the LPCVD layer comprises a sublayer of silicon oxide and a sublayer of silicon nitride, said sublayers have respective thicknesses, and the respective thicknesses are selected to provide a reflection minimum at a specified wavelength.

8. The method of claim 1, further comprising, before forming the LPCVD layer, performing a passivating, low-energy ion implantation into the face of the silicon device wafer opposite to the LPCVD layer, thereby defining the silicon device layer.

9. The method of claim 1, further comprising, before forming the LPCVD layer: performing a passivating, low-energy ion implantation into the face of the silicon device wafer opposite to the LPCVD layer, thereby defining the silicon device layer, wherein said implantation is performed through an oxide layer; removing said oxide layer after the implantation; and replaced said oxide layer with a regrown layer of thermal oxide.

* * * * *